US009202879B2

(12) United States Patent
Koburger, III et al.

(10) Patent No.: US 9,202,879 B2
(45) Date of Patent: Dec. 1, 2015

(54) MASK FREE PROTECTION OF WORK FUNCTION MATERIAL PORTIONS IN WIDE REPLACEMENT GATE ELECTRODES

(71) Applicant: GLOBALFOUNDRIES INC., Grand Cayman (KY)

(72) Inventors: Charles W. Koburger, III, Delmar, NY (US); Marc A. Bergendahl, Hopewell Junction, NY (US); David V. Horak, Essex Junction, VT (US); Shom Ponoth, Clifton Park, NY (US); Chih-Chao Yang, Glenmont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 415 days.

(21) Appl. No.: 13/775,988

(22) Filed: Feb. 25, 2013

(65) Prior Publication Data

US 2013/0309857 A1    Nov. 21, 2013

Related U.S. Application Data

(63) Continuation of application No. 13/471,852, filed on May 15, 2012, now Pat. No. 8,629,511.

(51) Int. Cl.
*H01L 21/336* (2006.01)
*H01L 29/40* (2006.01)
*E21B 43/30* (2006.01)
*E21B 47/12* (2012.01)

(52) U.S. Cl.
CPC ............ *H01L 29/401* (2013.01); *E21B 43/305* (2013.01); *E21B 47/122* (2013.01)

(58) Field of Classification Search
None
See application file for complete search history.

(56) References Cited

U.S. PATENT DOCUMENTS 8,310,012 B2 * 11/2012 Hwang et al. ................. 257/371
2012/0119307 A1    5/2012 Li et al.
2013/0020658 A1    1/2013 Guo et al.

OTHER PUBLICATIONS

Notice of Allowance dated Sep. 4, 2013 received in parent U.S. Patent Application, namely U.S. Appl. No. 13/471,852.

* cited by examiner

*Primary Examiner* — Kyoung Lee
(74) *Attorney, Agent, or Firm* — Scully, Scott, Murphy & Presser, P.C.

(57) ABSTRACT

In a replacement gate scheme, after formation of a gate dielectric layer, a work function material layer completely fills a narrow gate trench, while not filling a wide gate trench. A dielectric material layer is deposited and planarized over the work function material layer, and is subsequently recessed to form a dielectric material portion overlying a horizontal portion of the work function material layer within the wide gate trench. The work function material layer is recessed employing the dielectric material portion as a part of an etch mask to form work function material portions. A conductive material is deposited and planarized to form gate conductor portions, and a dielectric material is deposited and planarized to form gate cap dielectrics.

17 Claims, 17 Drawing Sheets

MASK FREE PROTECTION OF WORK FUNCTION MATERIAL PORTIONS IN WIDE REPLACEMENT GATE ELECTRODES

CROSS REFERENCE TO RELATED APPLICATION

This application is a continuation of U.S. patent application Ser. No. 13/471,852, filed May 15, 2012 the entire content and disclosure of which is incorporated herein by reference.

BACKGROUND

The present disclosure relates to semiconductor devices, and particularly to semiconductor structures having a wide replacement gate electrode including a work function material portion, and methods of manufacturing the same.

Work function materials are employed in replacement gate electrodes to optimize the work function of field effect transistors. Most work function metals, however, have a greater resistivity than gate electrode materials such as W or Al. Thus, the thickness of the work function metal need to be controlled in a gate electrode.

A narrow gate cavity having a width less than twice the thickness of a work function material layer can be filled with the work function metal and recessed to a desired thickness. Deposition and recessing the work function metal in a wide gate cavity having a width greater than the thickness of the work function material layer, however, can cause complete removal of the work function metal from a center portion thereof. Thus, an integration scheme is desired that allows a deposited work function metal in wide gate cavities to remain in contact with the entire gate dielectric after formation of gate electrodes.

BRIEF SUMMARY

In a replacement gate scheme, a wide gate trench and a narrow gate trench are formed in a planarization dielectric layer to define regions for gate electrodes of a first field effect transistor and a second field effect transistor. After formation of a gate dielectric layer, a work function material layer completely fills the narrow gate trench, while not filling the wide gate trench. A dielectric material layer is deposited and planarized over the work function material layer, and is subsequently recessed to form a dielectric material portion overlying a horizontal portion of the work function material layer within the wide gate trench. The work function material layer is recessed employing the dielectric material portion as a part of an etch mask to form work function material portions. A conductive material is deposited and planarized to form gate conductor portions, and a dielectric material is deposited and planarized to form gate cap dielectrics. The dielectric material portion protects horizontal portions of the work function material layer during the recessing of the work function material layer so that the work function material portion formed within the wide gate trench has a uniform thickness.

According to an aspect of the present disclosure, a semiconductor structure including a field effect transistor is provided. The field effect transistor (FET) includes a gate stack including a gate dielectric and a gate electrode and located on a semiconductor substrate. The gate electrode includes: a work function material portion contacting the gate dielectric; a dielectric material portion contacting the work function material portion; and a conductive material portion contacting the dielectric material portion, wherein the dielectric material portion is encapsulated by the work function material portion and the conductive material portion.

According to another aspect of the present disclosure, a method of forming a semiconductor structure including a field effect transistor (FET) is provided. A gate cavity laterally surrounded by a planarization dielectric layer on a semiconductor substrate is formed, wherein a top surface of the semiconductor substrate is exposed at a bottom of the gate cavity. A gate dielectric is formed over the top surface of the semiconductor substrate in the gate cavity. A work function material layer is formed on the gate dielectric. A dielectric material portion is formed on a horizontal portion of the work function material layer within the gate cavity. The work function material layer is recessed, wherein a remaining portion of the work function material layer becomes a work function material portion. A conductive material portion is then formed over the dielectric material portion and the work function material portion, wherein a gate electrode of the field effect transistor includes the conductive material portion and the work function material portion.

DETAILED DESCRIPTION

Figure 1:
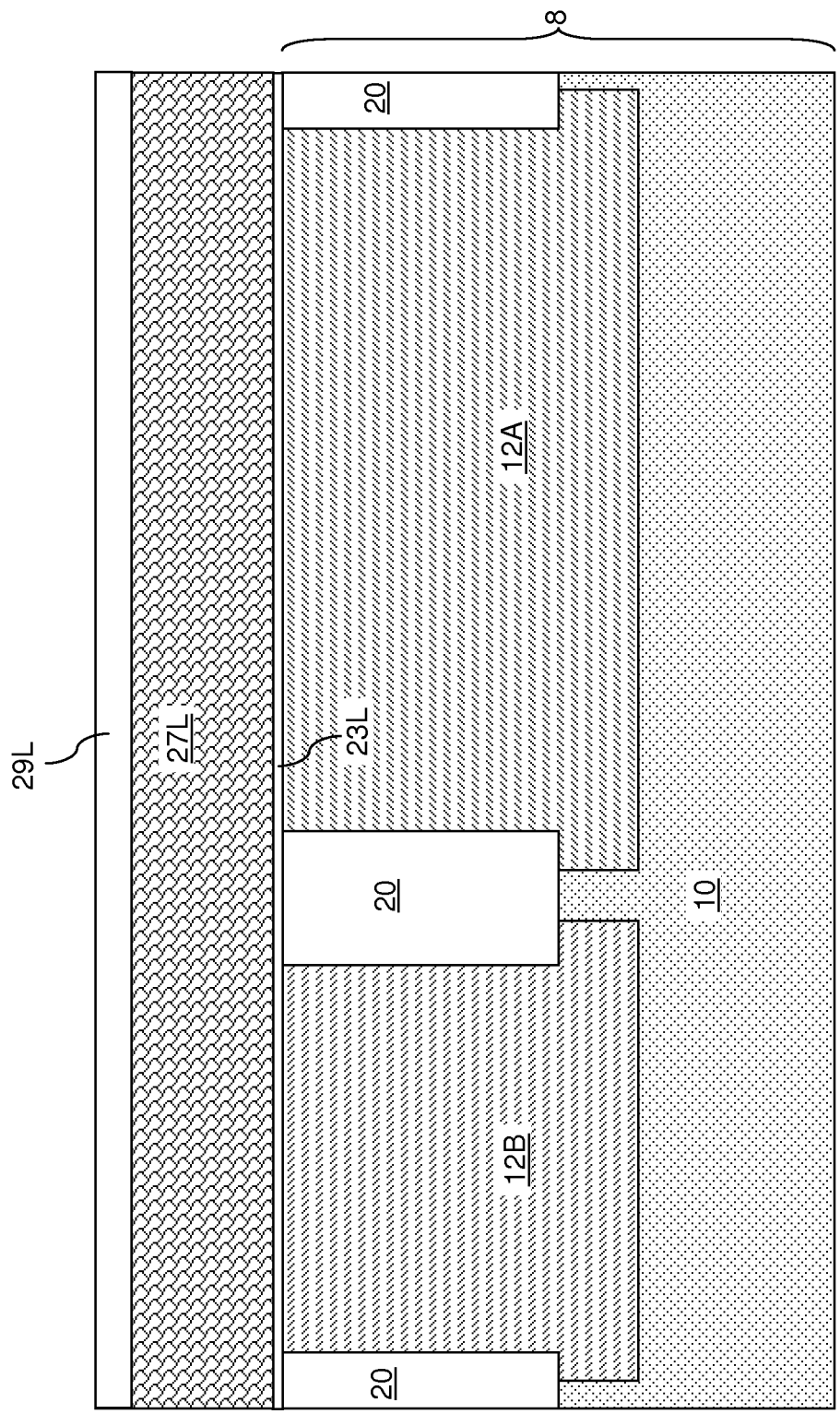
FIG. 1 is a vertical cross-sectional view of a first exemplary semiconductor structure after formation of disposable gate layers according to an embodiment of the present disclosure.

The present disclosure which relates to semiconductor structures having a wide replacement gate electrode including a work function material portion, and methods of manufacturing the same, will now be described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to an embodiment of the present disclosure includes a semiconductor substrate 8, on which various components of field effect transistors are subsequently formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with suitable electrical dopants as known in the art. Planar semiconductor devices, such as planar field effect transistors, or non-planar semiconductor devices, such as fin field effect transistors, are subsequently formed on the various doped portions of the semiconductor substrate 8. While the processing steps of the present disclosure are illustrated for planar field effect transistors, the same processing steps can be employed in combination with formation of semiconductor fins as known in the art to form fin field effect transistors (finFETs).

Field effect transistors having different sizes can be formed on the semiconductor substrate 8. For example, field effect transistors having different gate lengths can be formed on the semiconductor substrate 8 In an illustrated example, a first field effect transistor having a gate length that is greater than twice the lateral thickness of a work function material layer to be employed can be formed on a first body region 12A, and a second field effect transistor having a gate length that is less than twice the lateral thickness of the work function material layer to be employed can be formed on a second body region 12B. The first body region 12A and the second body region 12B are doped with a dopant concentration suitable for a body of a field effect transistor as known in the art. In a finFET embodiment, each of the first body region 12A and the second body region 12B can encompass the entirety of a semiconductor fin.

Shallow trench isolation structures 20 can be formed to laterally separate each of the first body region 12A and the second body region 12B. In one embodiment, each of the first body region 12A and the second body region 12B can be laterally surrounded by a contiguous portion of the shallow trench isolation structures 20. If the semiconductor substrate 8 is a semiconductor-on-insulator substrate, bottom surfaces of the first body region 12A and the second body region 12B may contact a buried insulator layer (not shown), which electrically isolates each of the first body region 12A and the second body region 12B from other semiconductor portions of the semiconductor substrate 8 in conjunction with the shallow trench isolation structures 20. Topmost surfaces of the shallow trench isolation structures 20 can be substantially coplanar with, raised above, or recessed below, topmost surfaces of the first body region 12A and the second body region 12B.

Disposable gate level layers are deposited on the semiconductor substrate 8 as blanket layers, i.e., as unpatterned contiguous layers. The disposable gate level layers can include, for example, a vertical stack of a disposable gate dielectric layer 23L, a disposable gate material layer 27L, and a disposable gate cap dielectric layer 29L. The disposable gate dielectric layer 23L can be, for example, a layer of silicon oxide, silicon nitride, or silicon oxynitride. The thickness of the disposable gate dielectric layer 23L can be from 1 nm to 10 nm, although lesser and greater thicknesses can also be employed. The disposable gate material layer 27L includes a material that can be subsequently removed selective to the dielectric material of a planarization dielectric layer to be subsequently formed. For example, the disposable gate material layer 27L can include a semiconductor material such as a polycrystalline semiconductor material or an amorphous semiconductor material. The thickness of the disposable gate material layer 27L can be from 30 nm to 300 nm, although lesser and greater thicknesses can also be employed. The disposable gate cap dielectric layer 29L can include a dielectric material such as silicon oxide, silicon nitride, or silicon oxynitride. The thickness of the disposable gate cap dielectric layer 29L can be from 3 nm to 30 nm, although lesser and greater thicknesses can also be employed. While the present disclosure is illustrated with disposable gate level layers including a vertical stack of a disposable gate dielectric layer 23L, a disposable gate material layer 27L, and a disposable gate cap dielectric layer 29L, any other disposable gate level layers can also be employed provided that the material(s) in the disposable gate level layers can be removed selective to a planarization dielectric layer to be subsequently formed.

Figure 2:
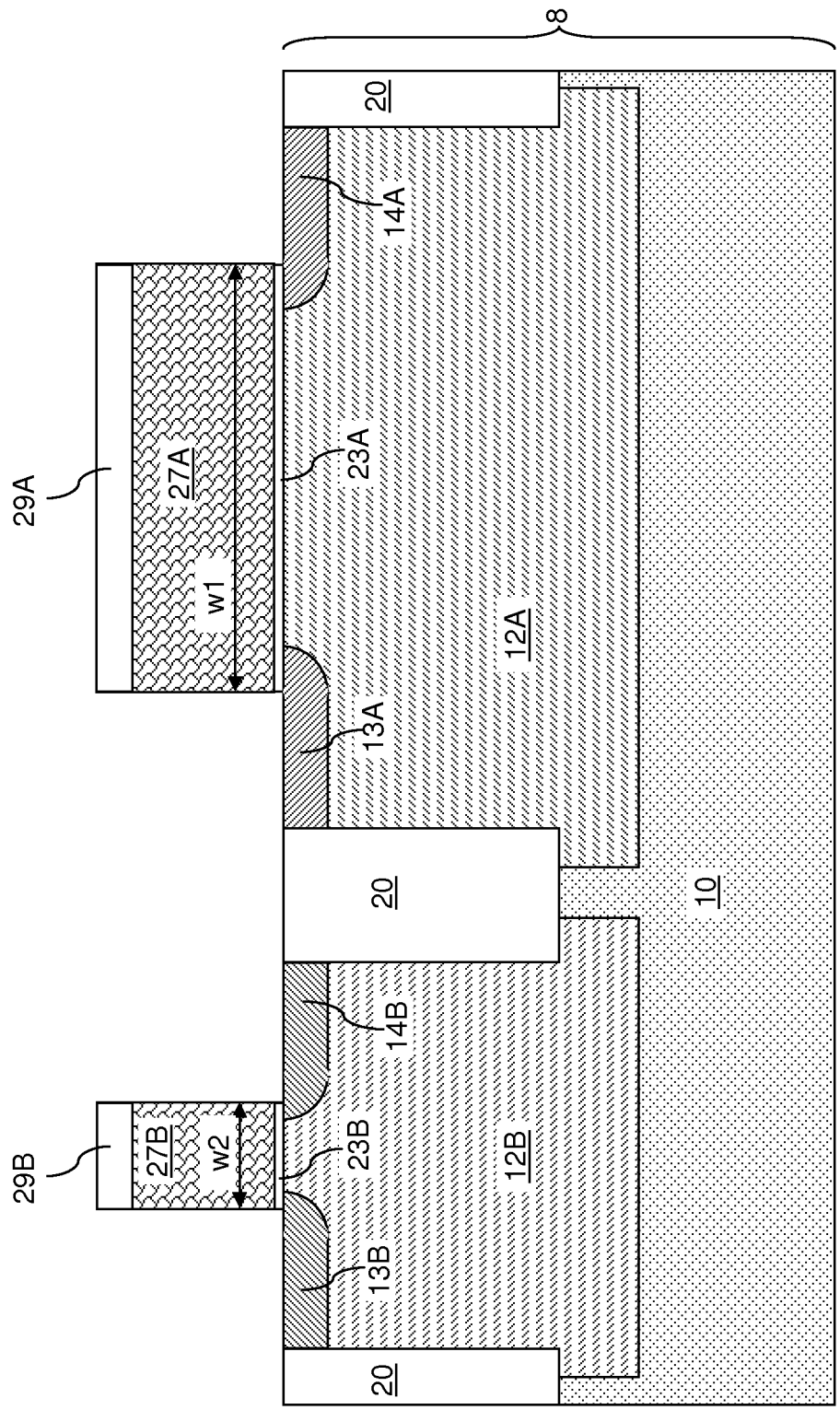
FIG. 2 is a vertical cross-sectional view of the first exemplary semiconductor structure after formation of disposable gate structures according to an embodiment of the present disclosure.

Referring to FIG. 2, the disposable gate level layers (29L, 27L, 23L) are lithographically patterned to form disposable gate structures. Specifically, a photoresist (not shown) is applied over the topmost surface of the disposable gate level layers (29L, 27L, 23L) and is lithographically patterned by lithographic exposure and development. The pattern in the photoresist is transferred into the disposable gate level layers (29L, 27L, 23L) by an etch, which can be an anisotropic etch such as a reactive ion etch. The remaining portions of the disposable gate level layers (29L, 27L, 23L) after the pattern transfer constitute disposable gate structures.

The disposable gate stacks may include, for example, a first disposable gate structure formed over the first body region 12A in the first device region and a second disposable gate structure formed over the second body region 12B in the second device region. The first disposable gate structure is a stack of a first disposable gate dielectric portion 23A, a first disposable gate material portion 27A, and a first disposable gate cap portion 29A, and the second disposable gate structure is a stack of a second disposable gate dielectric portion 23B, a second disposable gate material portion 27B, and a second disposable gate cap portion 29B. The first disposable gate cap portion 29A and the second disposable gate cap portion 29B are remaining portions of the disposable gate cap dielectric layer 29L. The first disposable gate material portion 27A and the second disposable gate material portion 27B are remaining portions of the disposable gate material layer 27L. The first disposable gate dielectric portion 23A and the second disposable gate dielectric portion 23B are remaining portions of the disposable gate dielectric layer 23L.

A lateral dimension, which is herein referred to as a width, along the direction of the gate length of a field effect transistor to be formed, can be different between the first disposable gate structure (23A, 25A, 29A) and the second disposable gate structure (23B, 25B, 29B). For example, a first width w1, which is a first lateral dimension of the first disposable gate structure (23A, 25A, 29A) along the horizontal direction within the plane of the vertical cross-section of FIG. 2 can be greater than the sum of twice the lateral thickness of the work function material layer to be employed and twice the lateral thickness of vertical portions of a gate dielectric layer to be subsequently formed. A second width w2, which is a second lateral dimension of the second disposable gate structure (23B, 25B, 29B) along the horizontal direction within the plane of the vertical cross-section of FIG. 2 can be smaller than the sum of twice the lateral thickness of the work function material layer to be employed and twice the lateral thickness of vertical portions of a gate dielectric layer to be subsequently formed.

Ion implantations can be employed to form various source extension regions and drain extension regions. For example, dopants can be implanted into portions of the first body region 12A that are not covered by the first disposable gate structure (23A, 27A, 29A) to form a first source extension region 13A and a first drain extension region 14A. A p-n junction can be formed between the first body region 12A and each of the first source extension region 13A and the first drain extension region 14A. Similarly, dopants can be implanted into portions of the second body region 12B that are not covered by the second disposable gate structure (23B, 27B, 29B) to form a second source extension region 13B and a second drain extension region 14AB. A p-n junction can be formed between the second body region 12B and each of the second source extension region 13B and the second drain extension region 14B.

Figure 3:
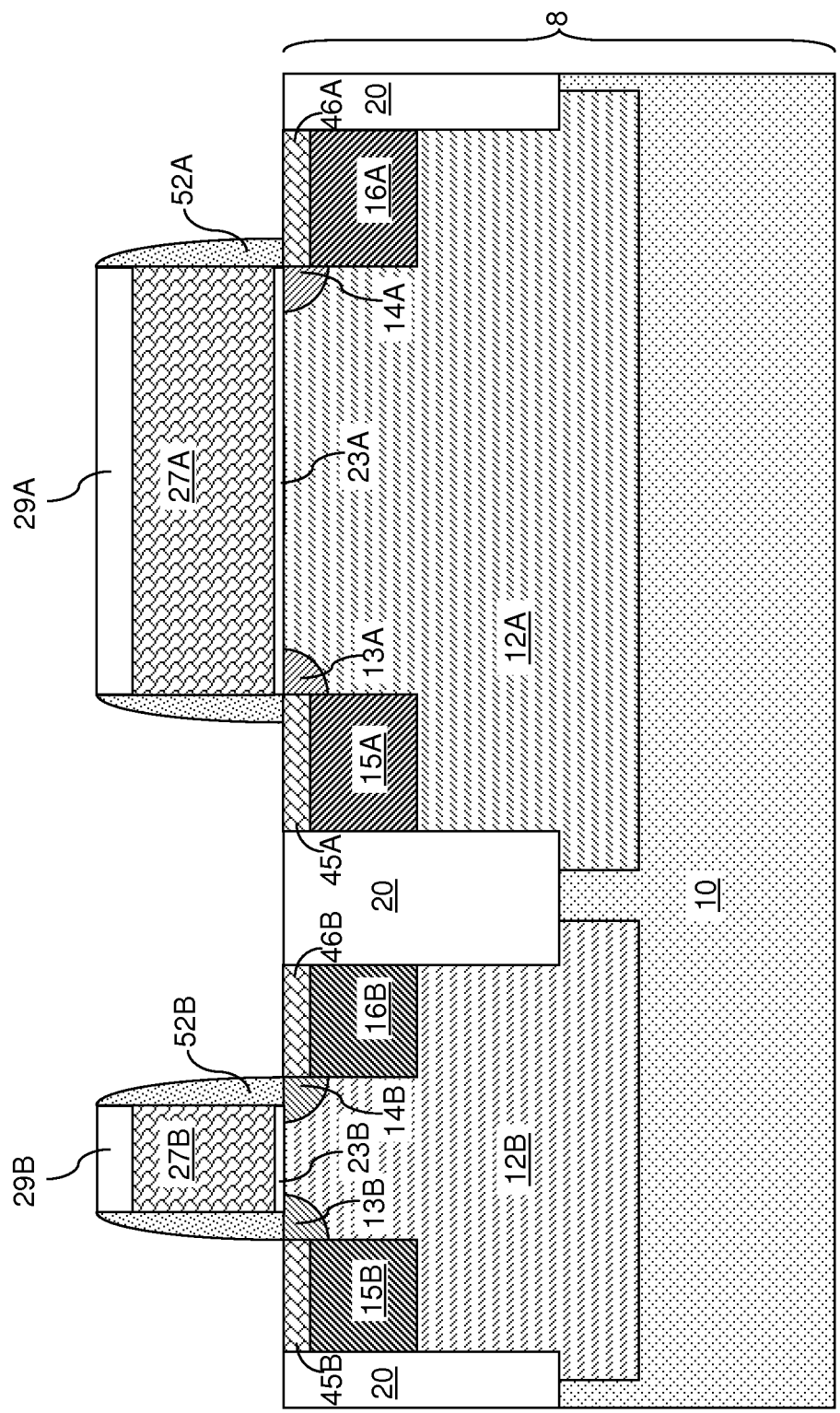
FIG. 3 is a vertical cross-sectional view of the first exemplary semiconductor structure after formation of source/drain regions according to an embodiment of the present disclosure.

Referring to FIG. 3, gate spacers can be formed on sidewalls of each of the disposable gate structures, for example, by deposition of a conformal dielectric material layer and an anisotropic etch. The gate spacers can include a first gate spacer 52A formed around the first disposable gate structure (23A, 27A, 29A) and a second gate spacer 52B formed around the second disposable gate structure (23B, 27B, 29B).

Ion implantations can be employed to form various source regions and drain regions. For example, dopants can be implanted into portions of the first body region 12A that are not covered by the first disposable gate structure (23A, 27A, 29A) or the first gate spacer 52A to form a first source region 15A and a first drain region 16A. A p-n junction can be formed between the first body region 12A and each of the first source region 15A and the first drain region 16A. Similarly, dopants can be implanted into portions of the second body region 12B that are not covered by the second disposable gate structure (23B, 27B, 29B) or the second gate spacer 52B to form a second source region 15B and a second drain region 16B. A p-n junction can be formed between the second body region 12B and each of the second source region 15B and the second drain region 16B.

In one embodiment, semiconductor material can be removed from the portions of the semiconductor substrate that are not covered by the disposable gate structures, gate spacers (52A, 52B), or the shallow trench isolation structures 20 to form cavities within the semiconductor substrate 8. The cavities can be subsequently formed with semiconductor materials having a doping of the opposite conductivity type than the conductivity type of the doping of the first body region 12A or the second body region 12B to form the first source and drain regions (15A, 16A) and/or the second source and drain regions (15B, 15B). A p-n junction can be formed between the first body region 12A and each of the first source region 15A and the first drain region 16A, and a p-n junction can be formed between the second body region 12B and each of the second source region 15B and the second drain region 16B.

Various metal semiconductor alloy portions can be formed on the exposed semiconductor material on the top surface of the semiconductor substrate 8, for example, by deposition of a metal layer (not shown) and an anneal. Unreacted portions of the metal layer can be removed selective to reacted portions of the metal layer. The reacted portions of the metal layer constitute the metal semiconductor alloy portions, which can include, for example, a first source metal semiconductor alloy portion 45A, a first drain metal semiconductor alloy portion 46A, a second source metal semiconductor alloy portion 45B, and a second drain metal semiconductor alloy portion 46B. The various metal semiconductor alloy portions (45A, 46A, 45B, 46B) can include a metal silicide if the first source region 15A, the first drain region 16A, the second source region 15B, and/or the second drain region 16B include silicon.

Figure 4:
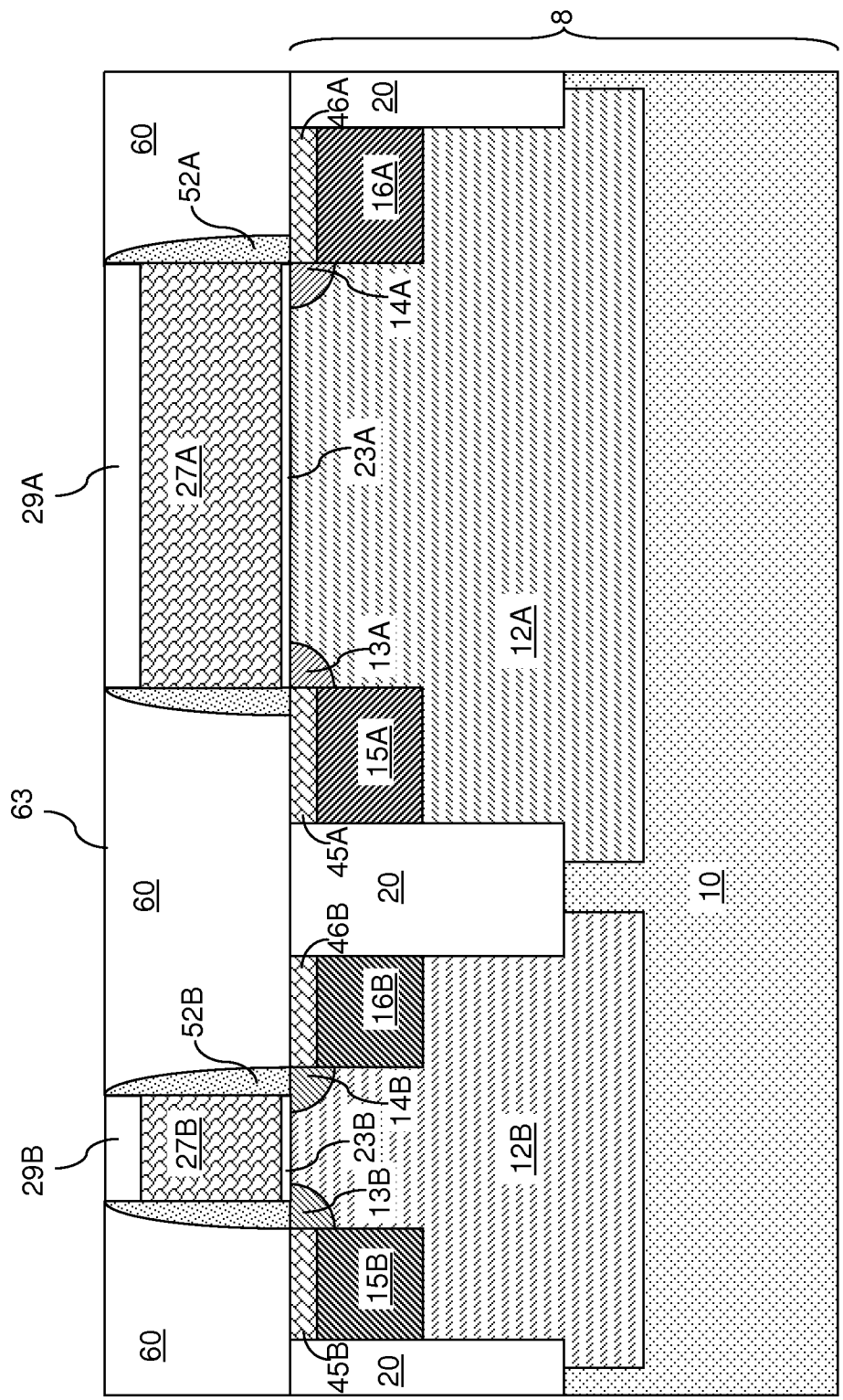
FIG. 4 is a vertical cross-sectional view of the first exemplary semiconductor structure after deposition and planarization of a planarization dielectric layer according to an embodiment of the present disclosure.

Referring to FIG. 4, a dielectric liner (not shown) can be optionally deposited over the metal semiconductor alloy portions (45A, 46A, 45B, 46B), the first and second disposable gate structures (23A, 27A, 29A, 23B, 27B, 29B), and the first and second gate spacers (52A, 52B). Optionally, at least one stress-generating liner (not shown) can be formed over the first disposable gate structure (23A, 27A, 29A) and/or the second disposable gate structure (23B, 27B, 29B). Each of the at least one stress-generating liner can include a dielectric material that generates a compressive stress or a tensile stress to underlying structures, and can be a silicon nitride layer deposited by plasma enhanced chemical vapor deposition under various plasma conditions.

A planarization dielectric layer 60 is deposited over the metal semiconductor alloy portions (45A, 46A, 45B, 46B), the first and second disposable gate structures (23A, 27A, 29A, 23B, 27B, 29B), and the first and second gate spacers (52A, 52B) and over the optional at least one stress-generating liner, if present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60 and any additional dielectric material layers (which can include any of the at least one stress-generating liner and the dielectric liner that are present) are planarized to the topmost surfaces of the first and second disposable gate structures (23A, 27A, 29A, 23B, 27B, 29B), i.e., above the topmost surfaces of the first and second disposable gate cap portions (29A, 29B). The planarization can be performed, for example, by chemical mechanical planarization (CMP). The planar topmost surface of the planarization dielectric layer 60 is herein referred to as a planar dielectric surface 63. The topmost surfaces of the disposable gate cap portions (29A, 29B) can be coplanar with the planar dielectric surface 63 after the planarization.

The combination of the first source extension region 13A, the first drain extension regions 14A, the first source region 15A, the first drain region 16A, and the first body region 12A can be employed to subsequently form a first field effect transistor. The combination of the second source extension region 13B, the second drain extension regions 14B, the second source region 15B, the second drain region 16B, and the second body region 12B can be employed to subsequently form a second field effect transistor.

Figure 5:
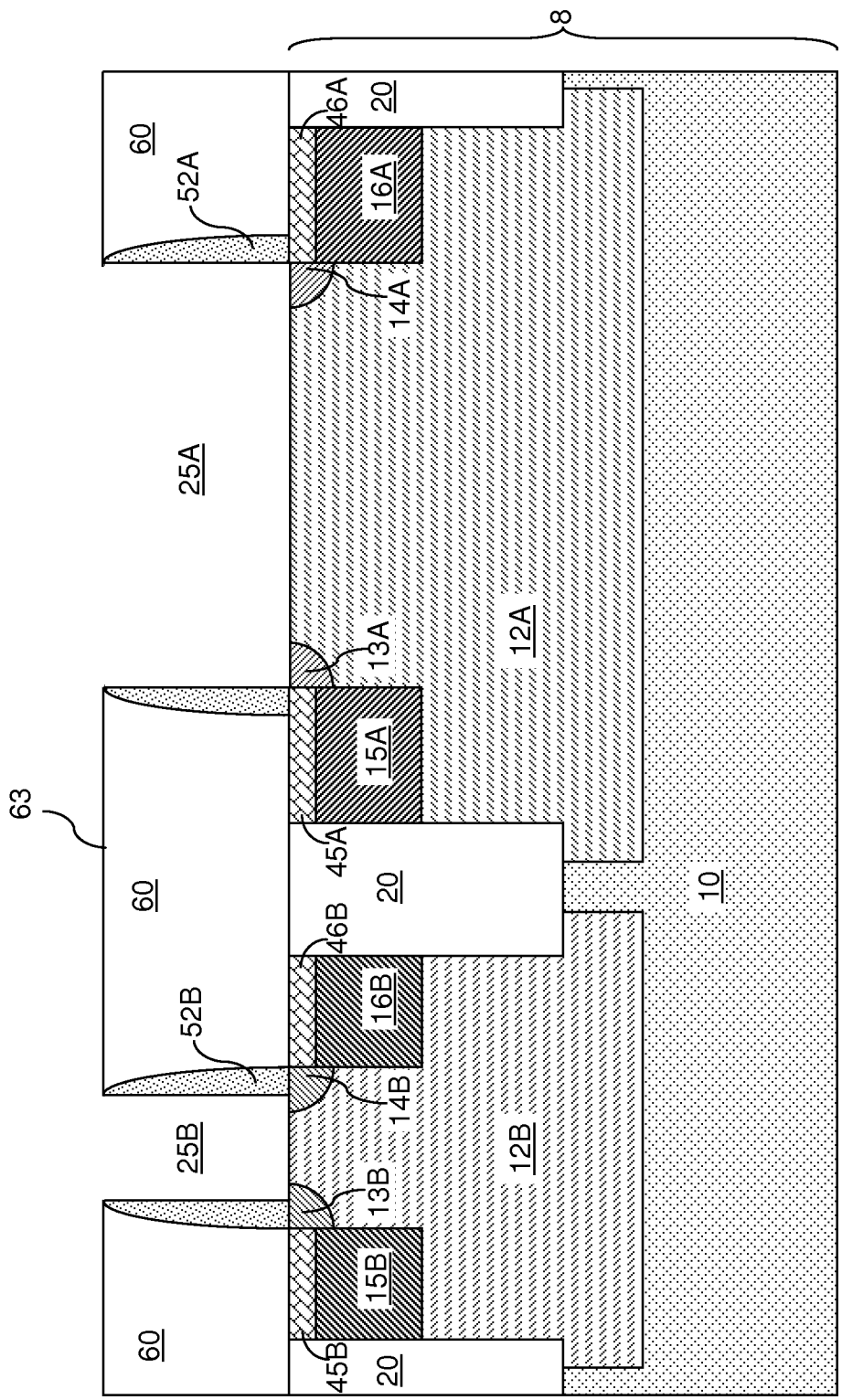
FIG. 5 is a vertical cross-sectional view of the first exemplary semiconductor structure after removal of the disposable gate structures according to an embodiment of the present disclosure.

Referring to FIG. 5, the first disposable gate structure (23A, 27A, 29A) and the second disposable gate structure (23B, 27B, 29B) are removed by at least one etch. The first and second disposable gate structures (23A, 27A, 29A, 23B, 27B, 29B) can be removed, for example, by at least one etch, which can include an anisotropic etch, an isotropic etch, or a combination thereof. The at least one etch can include a dry etch and/or a wet etch. In one embodiment, the at least one etch employed to remove the first and second disposable gate structures (23A, 27A, 29A, 23B, 27B, 29B) is selective to the dielectric materials of the planarization dielectric layer 60 and any other dielectric material layer that is present above the semiconductor substrate 8.

A first gate cavity 25A can be formed in the volume from which the first disposable gate structure (23A, 27A, 29A) is removed, and a second gate cavity 25B can be formed in the volume from which the second disposable gate structure (23B, 27B, 29B) is removed. A semiconductor surface of the semiconductor substrate 8, i.e., the top surface of the first body region 12A, is exposed at the bottom of the first gate cavity 25A. Another semiconductor surface of the semiconductor substrate 8, i.e., the top surface of the second body region 12B, is exposed at the bottom of the second gate cavity 25B. Each of the first and second gate cavities (25A, 25B) is laterally surrounded by the planarization dielectric layer 60. The first gate spacer 52A laterally surrounds the first gate cavity 25A, and the second gate spacer 52B laterally surrounds the second gate cavity 25B. The inner sidewalls of the first gate spacer 52A can be substantially vertical, and can extend from the top surface of the first body region 12A to the planar dielectric surface 63, i.e., the topmost surface, of the planarization dielectric layer 60. Further, the inner sidewalls of the second gate spacer 52B can be substantially vertical, and can extend from the top surface of the second body region 12B to the planar dielectric surface 63 of the planarization dielectric layer 60. The first gate cavity 25A can be a "wide gate trench," which refers to a gate cavity that will not be completely filled with a work function material layer to be subsequently deposited, and the second gate cavity 25B can be a "narrow gate trench," which refers to a gate cavity which will be completely filled with the work function material layer to be subsequently deposited.

Figure 6:
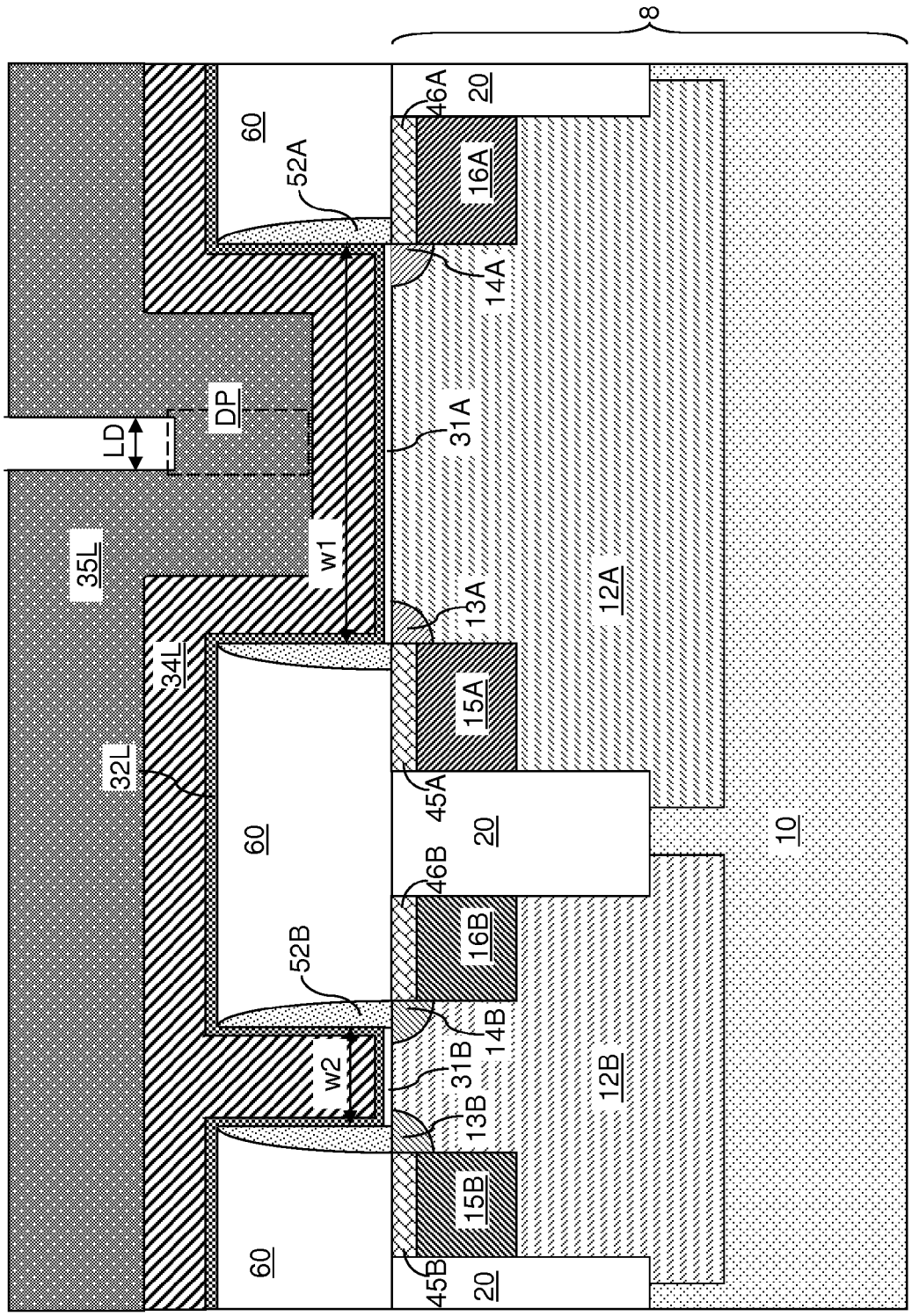
FIG. 6 is a vertical cross-sectional view of the first exemplary semiconductor structure after formation of a gate dielectric layer, a work function material layer, and a dielectric material layer according to an embodiment of the present disclosure.

Referring to FIG. 6, exposed portions of the semiconductor surfaces of the semiconductor substrate 8 can be converted to a dielectric material layer. For example, a first semiconductor-element-containing dielectric layer 31A can be formed on the exposed surface of the first body region 12A by conversion of the exposed semiconductor material into a dielectric material, and a second semiconductor-element-containing dielectric layer 31B can be formed on the exposed surface of the second body region 12B by conversion of the exposed semiconductor material into the dielectric material. The formation of the semiconductor-element-containing dielectric layers (31A, 31B) can be effected by thermal conversion, aqueous reaction, or plasma treatment. If the semiconductor material of the first body region 12A and the second body region 12B includes silicon, the semiconductor-element-containing dielectric layers (31A, 31B) can include silicon oxide or silicon nitride. The semiconductor-element-containing dielectric layers (31A, 31B) are interfacial dielectric layers that contact a semiconductor surface underneath and gate dielectrics to be subsequently deposited thereupon. The thickness of the semiconductor-element-containing dielectric layers (31A, 31B) can be from 0.3 nm to 1.2 nm, although lesser and greater thicknesses can also be employed.

A gate dielectric layer 32L can be deposited on the bottom surfaces and sidewalls of the gate cavities (25A, 25B) and the topmost surface of the planarization dielectric layer 60. The gate dielectric layer 32L can be a high dielectric constant (high-k) material layer having a dielectric constant greater than 8.0. The gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. First exemplary high-k dielectric material include $HfO_2$, $ZrO_2$, $La_2O_3$, $Al_2O_3$, $TiO_2$, $SrTiO_3$, $LaALo_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32L, as measured at horizontal portions, can be from 0.9 nm to 6 nm, and preferably from 1.0 nm to 3 nm. The gate dielectric layer 32L may have an effective oxide thickness on the order of or less than 1 nm. In one embodiment, the gate dielectric layer 32L is a hafnium oxide ($HfO_2$) layer.

A work function material layer 34L including a metallic material can be deposited. The work function material layer 34L can include any metallic material known to adjust the work function of a gate electrode. For example, the work function material layer 34L can be a stack of metallic materials.

The work function material layer 34L can be deposited, for example, by physical vapor deposition (PVD) or chemical vapor deposition (CVD). The work function material layer 34L may, or may not, be conformal. In other words, the vertical portions of the work function material layer 34L may, or may not, have the same thickness as the horizontal portions of the work function material layer 34L.

The thickness of the work function material layer 34L is selected to properly set electrical properties of the devices. These thicknesses enable complete filling of the second gate cavity 25B, while not completely filling the first gate cavity 25A. Thus, a seam at which two portions of the work function material layer 34L laterally contact is formed along the middle portion of the second gate cavity 25B. In order to completely fill the second gate cavity 25B, the lateral thickness of the work function material layer 34L, i.e., the thickness of the work function material layer 34L along a horizontal direction at the top surface of the planarization dielectric layer 60, is greater than the second width w2 less twice the lateral thickness of the gate dielectric layer 32L, which is also measured along the horizontal direction at the top surface of the planarization dielectric layer 60. In one embodiment, the lateral thickness of the work function material layer 34L can be from 2.5 nm to 15 nm, although lesser and greater thicknesses can also be employed.

In one embodiment, the work function material layer 34L can include a stack of a first titanium nitride layer, a tantalum carbide layer, and a second titanium nitride layer. The thickness of the first titanium nitride layer can be from 0.5 nm to 5 nm. The thickness of the tantalum carbide layer can be from 0.5 nm to 5 nm. The thickness of the second titanium nitride layer can be from 0.5 nm to 5 nm.

Alternately or additionally, any other metallic material known to adjust the threshold voltage of a field effect transistor can be incorporated into the work function material layer 34L. Such metallic materials include, but are not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

A dielectric material layer 35L can be subsequently deposited on the work function material layer 34. The dielectric material layer 35L includes a dielectric material such as silicon nitride, undoped silicon oxide, a doped silicon oxide, and a dielectric metal oxide material. In one embodiment, the dielectric material of the planarization dielectric layer 60 is doped or undoped silicon oxide, and the dielectric material of the dielectric material layer 35L is silicon nitride. In another embodiment, the dielectric material of the planarization dielectric layer 60 is undoped silicon oxide, and the dielectric material of the dielectric material layer 35L is a doped silicon oxide such as carbon doped silicon oxide, fluorine doped silicon oxide, boron doped silicon oxide, and a phosphorus doped silicon oxide. The dielectric material layer 35L can be deposited, for example, by chemical vapor deposition (CVD), spin-coating, or atomic layer deposition (ALD).

The thickness of the dielectric material layer 35L is selected such that the top surface of the dielectric material layer 35L is no lower than the topmost surface of the planarization dielectric layer 60 in the region that fills the first gate cavity 25A (See FIG. 5). The lateral distance LD of a depressed portion DP of the dielectric material layer 35L (e.g., the lateral distance between the two sidewalls of the dielectric material layer 35L overlying the first semiconductor-element-containing dielectric layer 31A) can be any dimension. For example, the lateral distance LD of the depressed portion DP of the dielectric material layer 35L can be from 1 nm to 10 microns.

Figure 7:
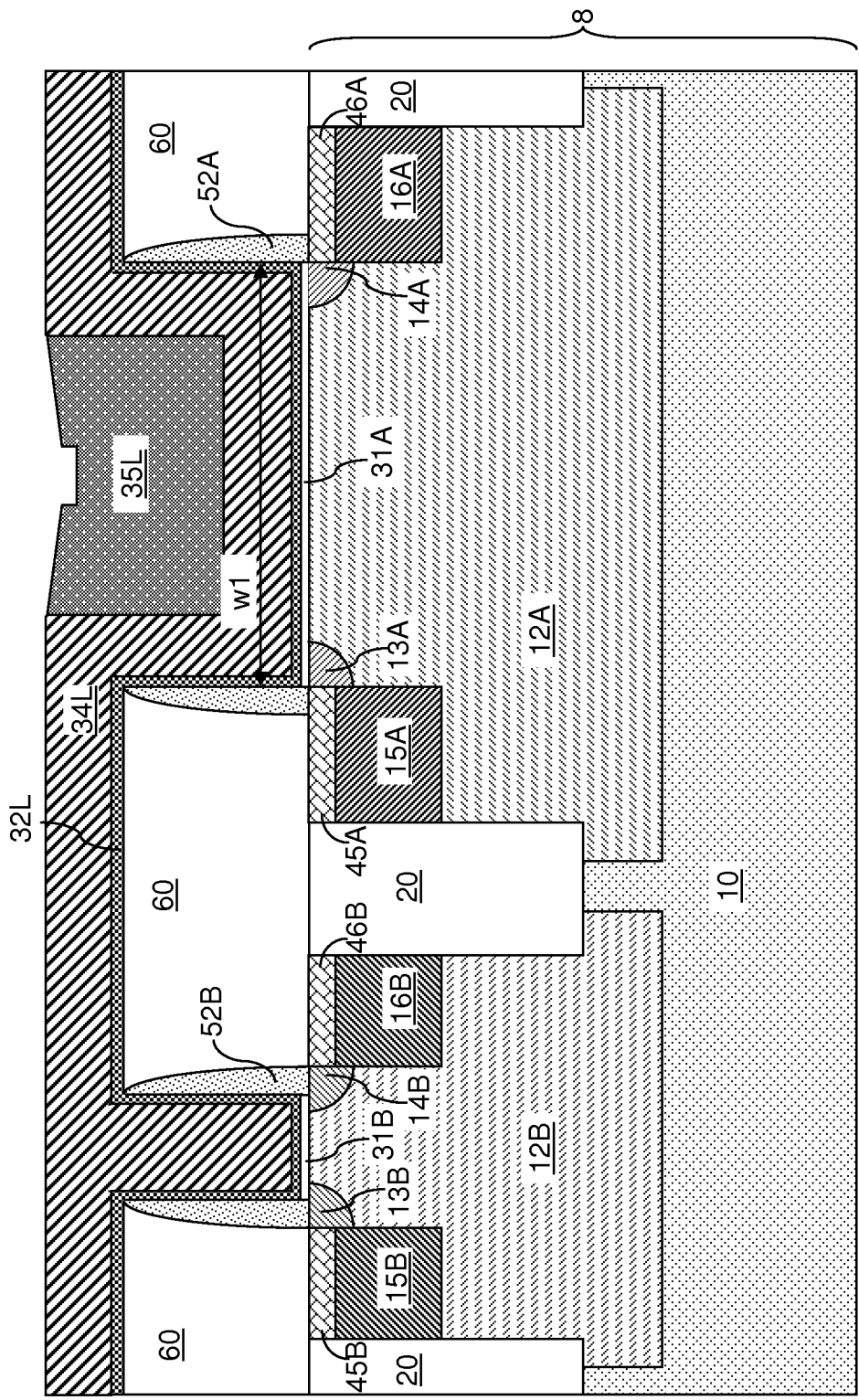
FIG. 7 is a vertical cross-sectional view of the first exemplary semiconductor structure after planarization of the dielectric material layer according to an embodiment of the present disclosure.

Referring to FIG. 7, the dielectric material layer 35L is planarized to remove the portions of the dielectric material layer 35L that overlie the topmost surface of the work function material layer 34L. In one embodiment, chemical mechanical planarization (CMP) can be employed to planarize the dielectric layer 35L. In one embodiment, the dielectric material layer 35L can be removed employing the work function material layer 34L as a stopping layer. In one embodiment, dishing during the CMP can cause the center of the remaining portion of the dielectric material layer 35L to be recessed below the topmost surface of the work function material layer 34, especially if the first width w1 is on the order of several microns or greater. Depending on the thickness of the dielectric material layer 35L as deposited, remnants of sidewalls of the dielectric material layer 35L may, or may not, be present after the planarization.

In particular, the dielectric material layer 35L can be removed from above the portion of the work function material layer 34L that fills the entirety of the second gate cavity (See FIG. 5) during the planarizing of the dielectric material layer 35L. Thus, the dielectric material layer 35L is not present over the portion of the work function material layer 34L that fills the entirety of the second gate cavity after the planarizing of the dielectric material layer 35L. The remaining portion of the dielectric material layer 35L is confined within a volume laterally surrounded by sidewalls of the work function material layer 34L overlying the first semiconductor-element-containing dielectric layer 31A. The remaining portion of the dielectric material layer 35L is herein referred to as a dielectric material portion 35.

Figure 8:
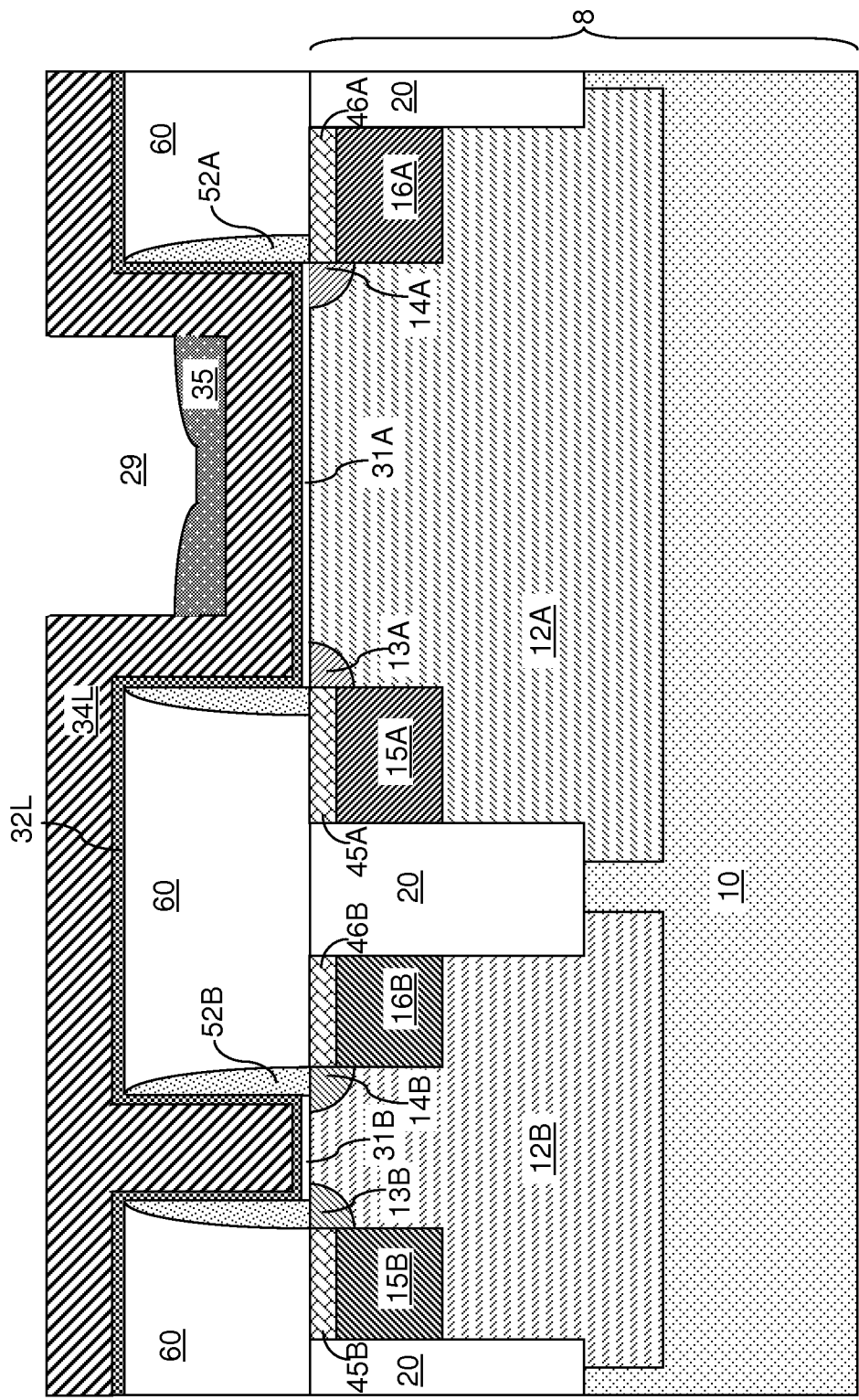
FIG. 8 is a vertical cross-sectional view of the first exemplary semiconductor structure after formation of a dielectric material portion in a wide gate trench according to an embodiment of the present disclosure.

Referring to FIG. 8, the dielectric material portion 35 can be recessed by an etch that employs physically exposed portions of the work function material layer 34L as an etch mask, i.e., the etch chemistry is selective to the material of the work function material layer 34L. The etch can be an anisotropic etch such as a reactive ion etch, or an isotropic etch such as a wet etch.

During the etch, the topmost surface of the dielectric material portion 35 can be recessed below the topmost surface of the planarization dielectric layer 60. In one embodiment, the dielectric material portion 35 does not include any hole therein, i.e., is topologically homeomorphic to a sphere. The thickness of the thinnest portion of the dielectric material portion 35 is greater than 0.5 nm. In one embodiment, the thickness of the thinnest portion of the dielectric material portion 35 can be from 10 nm to 50 nm, although lesser and greater thicknesses can also be employed. The entirety of the bottom surface of the dielectric material portion 35 can be planar, i.e., located within a same two-dimensional plane. Thus, the entirety of the bottom surface of the dielectric material portion 35 can be vertically spaced from a planar top surface of a horizontal portion of the gate dielectric layer 32L in contact with the first semiconductor-element-containing dielectric layer 31A by the same distance, which is the vertical thickness of the work function material layer 34L.

Figure 9:
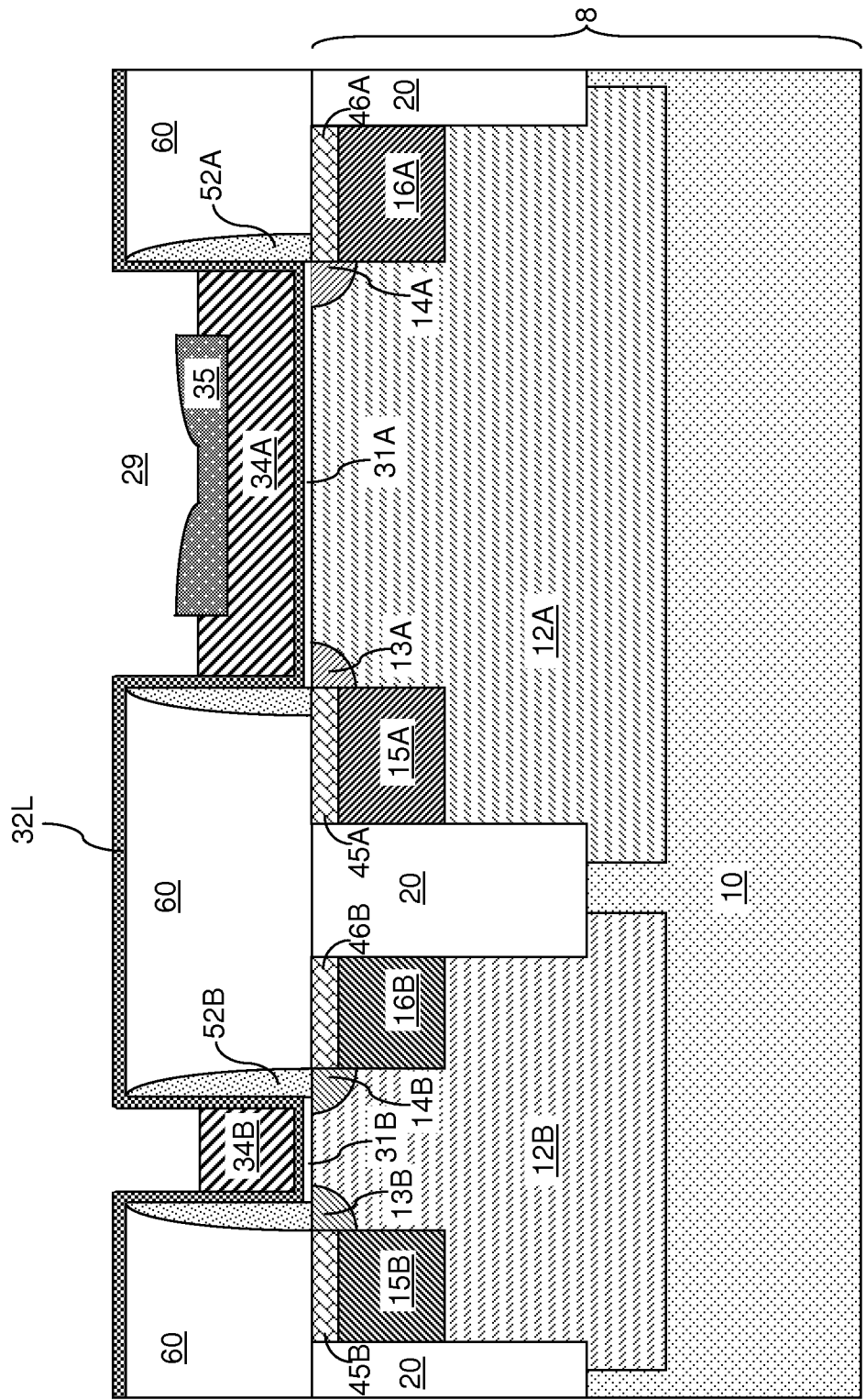
FIG. 9 is a vertical cross-sectional view of the first exemplary semiconductor structure after recessing of the work function material layer according to an embodiment of the present disclosure.

Referring to FIG. 9, the work function material layer 34L is etched employing the work function material portion 35 as an etch mask. A first remaining portion of the work function material layer 34L underneath a recessed region 29 above the first semiconductor-element-containing dielectric layer 31A becomes a work function material portion, which is herein referred to as a first work function material portion 34A. A second remaining portion of the work function material layer 34L above the second semiconductor-element-containing dielectric layer 31B becomes another work function material portion, which is herein referred to as a second work function material portion 34B.

The etch of work function metal layer 34L can be an isotropic etch such as a wet etch, or can be an anisotropic etch such as a reactive ion etch. The etch is selective to the dielectric material of the dielectric material portion 35. In one embodiment, the etch can also be selective to the dielectric material of the gate dielectric layer 32L. Alternately, physically exposed portions of the gate dielectric layer 32L may be partially or completely removed by the etch. Etching of the work function material layer 34L recesses the first work function material portion 34A (i.e., the remaining portion of the work function material layer 34L underneath the recessed region 29) below the topmost surface of the dielectric material portion 35. In one embodiment, the top surface of the first work function material portion 34A can laterally contact, and surround, sidewalls of the dielectric material portion 35. The etching of the work function material layer 34L recesses the topmost surface of the second work function material portion 34B below the top surface of the planarization dielectric layer 60.

In embodiments in which the gate dielectric layer 32L is not removed by the etch, the selection of the material for the dielectric material layer 35L (and correspondingly, for the dielectric material portion 35) can be made without regard to the material of the planarization dielectric layer 60. In embodiments in which the gate dielectric layer 32L is removed by the etch, the selection of the material for the dielectric material layer 35L can be made such that the dielectric material portion 35 has a lesser etch rate than the material of the planarization dielectric layer 60 after removal of the physically exposed portions of the gate dielectric layer 32L. For example, the dielectric material of the polarization dielectric layer 60 can be doped or undoped silicon oxide, and the dielectric material of the dielectric material layer 35L can be silicon nitride. Alternately, the dielectric material of the polarization dielectric layer 60 can be undoped silicon oxide, and the dielectric material of the dielectric material layer 35L can be a doped silicon oxide such as carbon doped silicon oxide, fluorine doped silicon oxide, boron doped silicon oxide, and a phosphorus doped silicon oxide.

Figure 10:
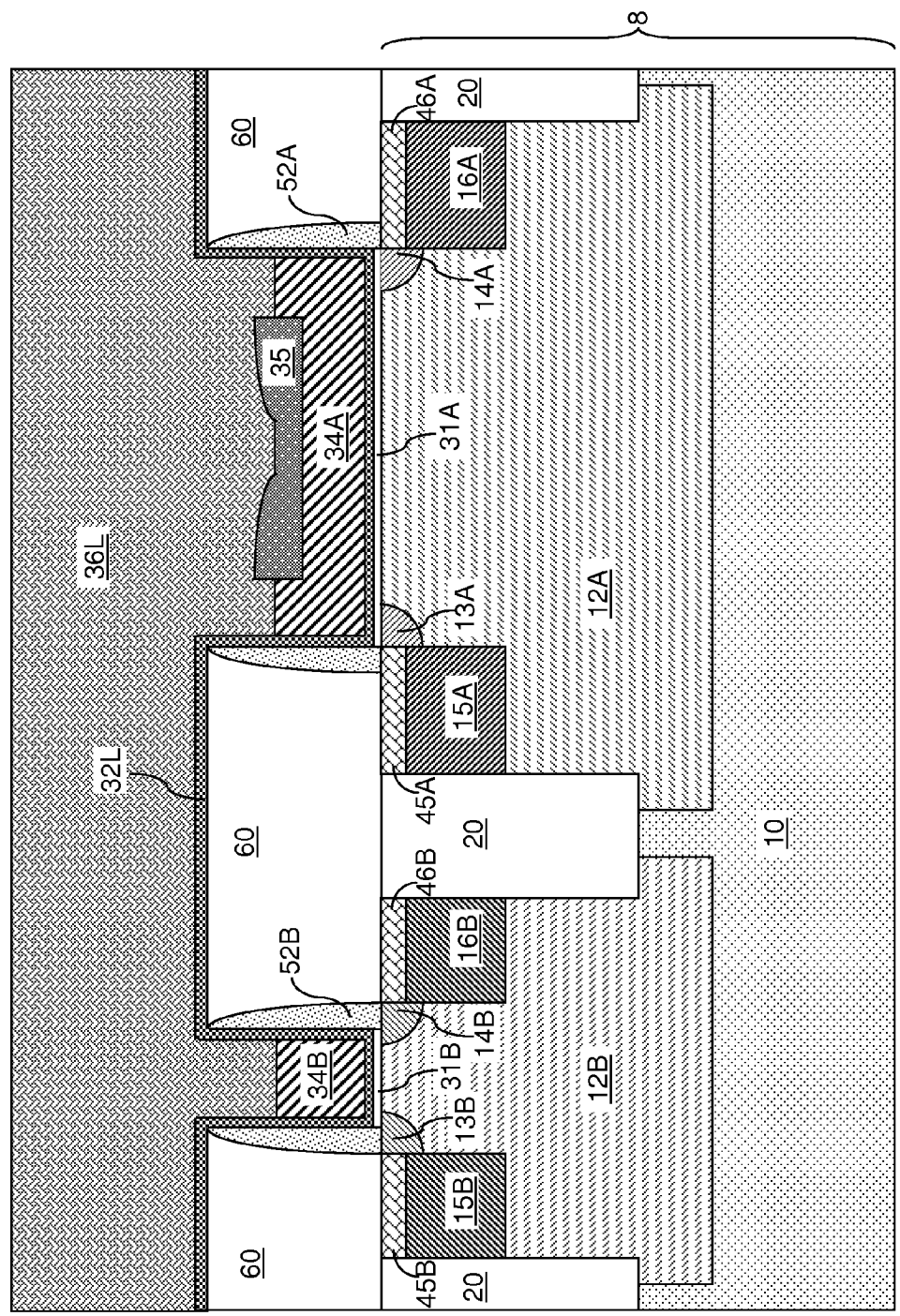
FIG. 10 is a vertical cross-sectional view of the first exemplary semiconductor structure after deposition of a conductive material layer according to an embodiment of the present disclosure.

Referring to FIG. 10, a conductive material layer 36L can be deposited on the first and second work function material portions (34A, 34B), the dielectric material portion 35, and the gate dielectric layer 32L (or the planarization dielectric layer 60 if physically exposed portions of the gate dielectric layer 32L is removed by the etch at the processing step of FIG. 9).

The recessed volumes overlying the first and second semiconductor-element-containing dielectric layers (31A, 31B) are filled with a conductive material layer 36L. The conductive material layer 36L can include a metal, which can be deposited by physical vapor deposition or chemical vapor deposition. The thickness of the conductive material layer 36L is set such that the entirety of the top surface of the conductive material layer 36L is located above the topmost surface of the gate dielectric layer 32L and the planarization dielectric layer 60. In one embodiment, the conductive material layer 36L can include at least one material selected from Al, Au, Ag, W, and Cu. In one embodiment, the conductive material layer 36L can consist essentially of a single elemental metal such as Al, Au, Ag, W, or Cu. For example, the conductive material layer 36L can consist essentially of aluminum. In one embodiment, the conductive material layer 36L may optionally contain an adhesion promotion layer, which can include, for example, Ti.

Figure 11:
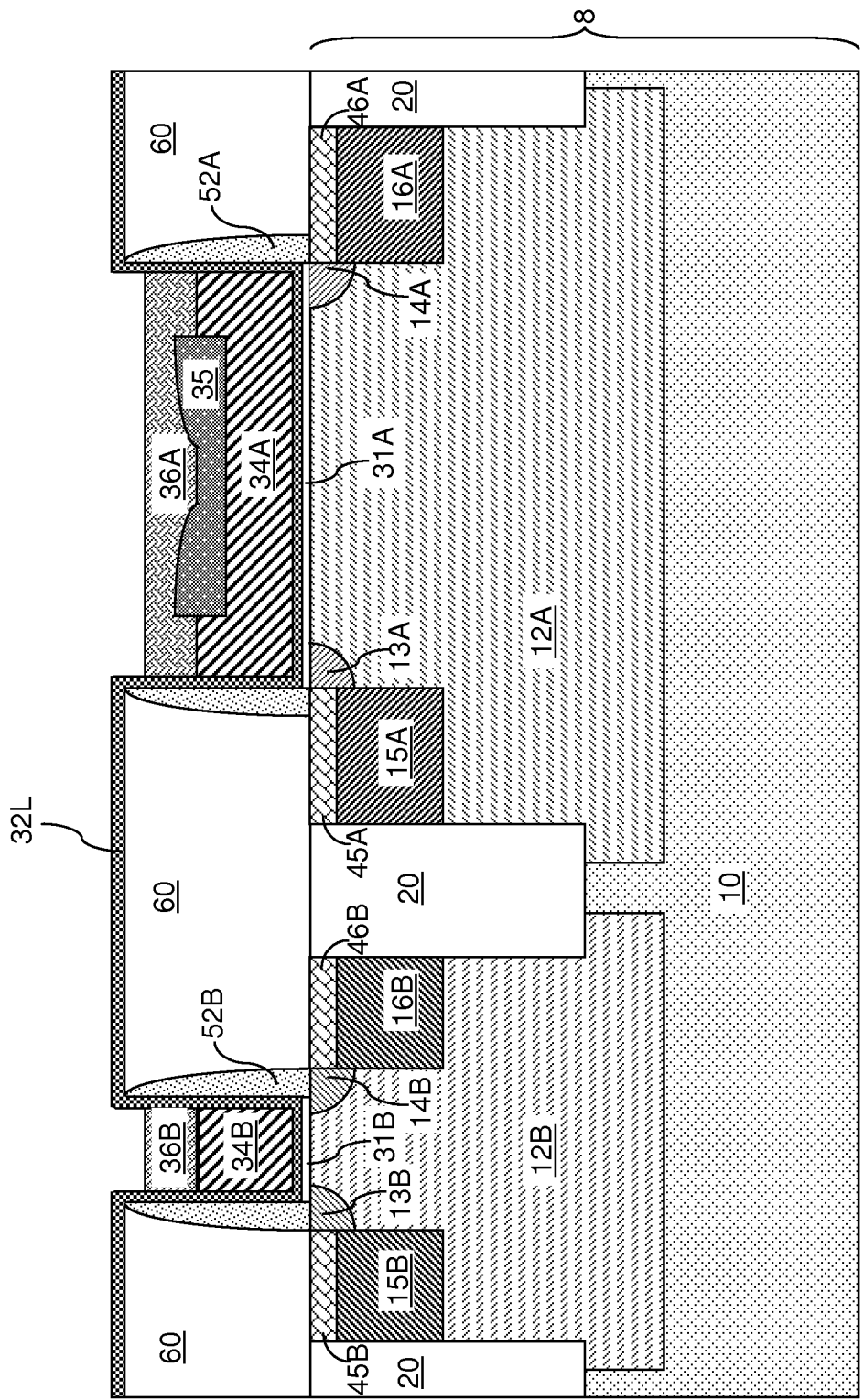
FIG. 11 is a vertical cross-sectional view of the first exemplary semiconductor structure after planarization and recessing of the conductive material layer according to an embodiment of the present disclosure.

Referring to FIG. 11, the conductive material layer 36L can be planarized, for example, by chemical mechanical planarization. For example, the conductive material layer 36L can be removed from above the topmost surface of the gate dielectric layer 32L and the planarization dielectric layer 60 employing the gate dielectric layer 32L and/or the planarization dielectric layer 60 as a stopping layer during chemical mechanical planarization.

Subsequently, the remaining portions of the conductive material layer 36L can be vertically recessed by an etch to form a first conductive material portion 36A that contacts the dielectric material portion 35 and the first work function material portion 34A, and a second conductive material portion 36B that contacts the second work function material portion 34B. The interface between the first conductive material portion 36A and the dielectric material portion 35 can be non-planar, or can be planar, depending on the initial thickness of the dielectric material layer 35L and subsequent processing steps employed to form the dielectric material portion 35. The interface between the first conductive material portion 36A and the first work function material portion 34A can be planar, or non-planar, depending on the etch process employed to form the first work function material portion 34A from the work function material layer 34L.

The first conductive material portion 36A and the first work function material portion 34A collectively constitute a gate electrode for the first field effect transistor, which is herein referred to as a first gate electrode (34A, 36A). The first gate electrode (34A, 36A) encapsulates the dielectric material portion 35 therein, i.e., the dielectric material portion 35 is encapsulated by the first work function material portion 34A and the first conductive material portion 36A. The second conductive material portion 36B and the second work function material portion 34B collectively constitute a gate electrode for the second field effect transistor, which is herein referred to as a second gate electrode (34B, 36B).

The conductive material portion 34A contacts the entire bottom surface of the dielectric material portion 35. All surfaces of the dielectric material portion 35 are in contact with a surface of the first work function material portion 34A or a surface of the first conductive material portion 36A. The interface between the first work function material portion 34A and the first conductive material portion 36A is in contact with, and laterally surrounds, the dielectric material portion 35.

Figure 12:
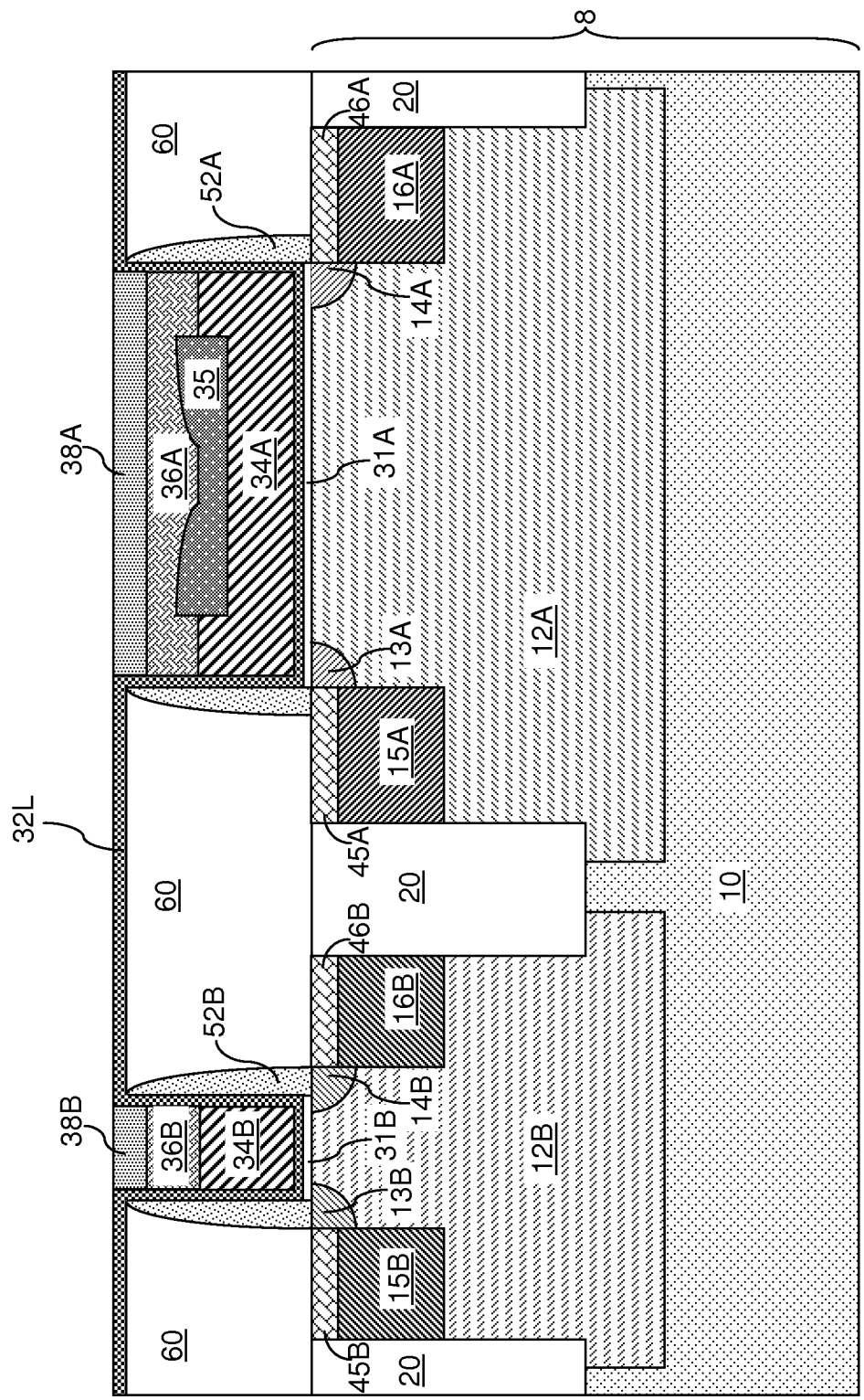
FIG. 12 is a vertical cross-sectional view of the first exemplary semiconductor structure after formation of gate cap dielectrics according to an embodiment of the present disclosure.

Referring to FIG. 12, gate cap dielectrics can be formed on the first and second conductive material portions (38A, 38B) by filling remaining portions of the gate cavities (25A, 25B; See FIG. 5) with a gate cap dielectric material and planarizing the gate cap dielectric material. For example, a gate cap dielectric material layer (not shown) including a dielectric material such as silicon nitride, silicon oxide, silicon oxynitride, and/or a dielectric metal oxide can be deposited by chemical vapor deposition (CVD). The thickness of the gate cap dielectric material layer can be selected so that the entirety of the top surface of the gate cap dielectric material layer is located at or above the plane of the topmost surface of the gate dielectric layer 32L and the planarization dielectric layer 60.

The gate cap dielectric material layer can be subsequently planarized, for example, by chemical mechanical planarization to form a first gate cap dielectric 38A in contact with the top surface of the first conductive material portion 36A, and a second gate cap dielectric 38B in contact with the top surface of the second conductive material portion 36B. The top surfaces of the first and second gate cap dielectrics (38A, 38B) can be coplanar with the topmost surface of the gate dielectric layer 32L, if the gate dielectric layer 32L is present over the planarization dielectric layer 60 after the planarization that forms the first and second gate cap dielectrics (38A, 38B), or can be coplanar with the topmost surface of the planarization dielectric layer 60 if the gate dielectric layer 32L is not present above the topmost surface of the planarization dielectric layer 60 after the planarization that forms the first and second gate cap dielectrics (38A, 38B).

The combination of the first semiconductor-element-containing dielectric layer 31A and a portion of the gate dielectric layer 32L in contact with the first gate electrode (34A, 36A) functions as the gate dielectric for the first field effect transistor, and is herein referred to as a first gate dielectric. The first gate dielectric includes a horizontal portion underlying the dielectric material portion 35 and vertical portions in contact with the first gate electrode (34A, 36A), i.e., the first work function material portion 34A and the conductive material portion 36A. The vertical portions of the first gate dielectric are laterally spaced from the dielectric material portion 35 by peripheral portions of the first gate electrode (34A, 36A). The planarization dielectric layer 60, located on the semiconductor substrate 8, embeds, and laterally surrounds, the first gate electrode (34A, 36A). The first gate dielectric, the first gate electrode (34A, 36A), the first gate cap dielectric 38A, and the dielectric material portion 35 collectively constitute a first gate stack that is embedded within the planarization dielectric layer 60.

The combination of the second semiconductor-element-containing dielectric layer 31B and a portion of the gate dielectric layer 32L in contact with the second gate electrode (34B, 36B) functions as the gate dielectric for the second field effect transistor, and is herein referred to as a second gate dielectric. The planarization dielectric layer 60, located on the semiconductor substrate 8, embeds, and laterally surrounds, the second gate electrode (34B, 36B). The second gate dielectric, the second gate electrode (34B, 36B), and the second gate cap dielectric 38B collectively constitute a second gate stack that is embedded within the planarization dielectric layer 60. The entire top surface of the second work function material portion 34B is in contact with the entire bottom surface of the second conductive material portion 36B.

Figure 13:
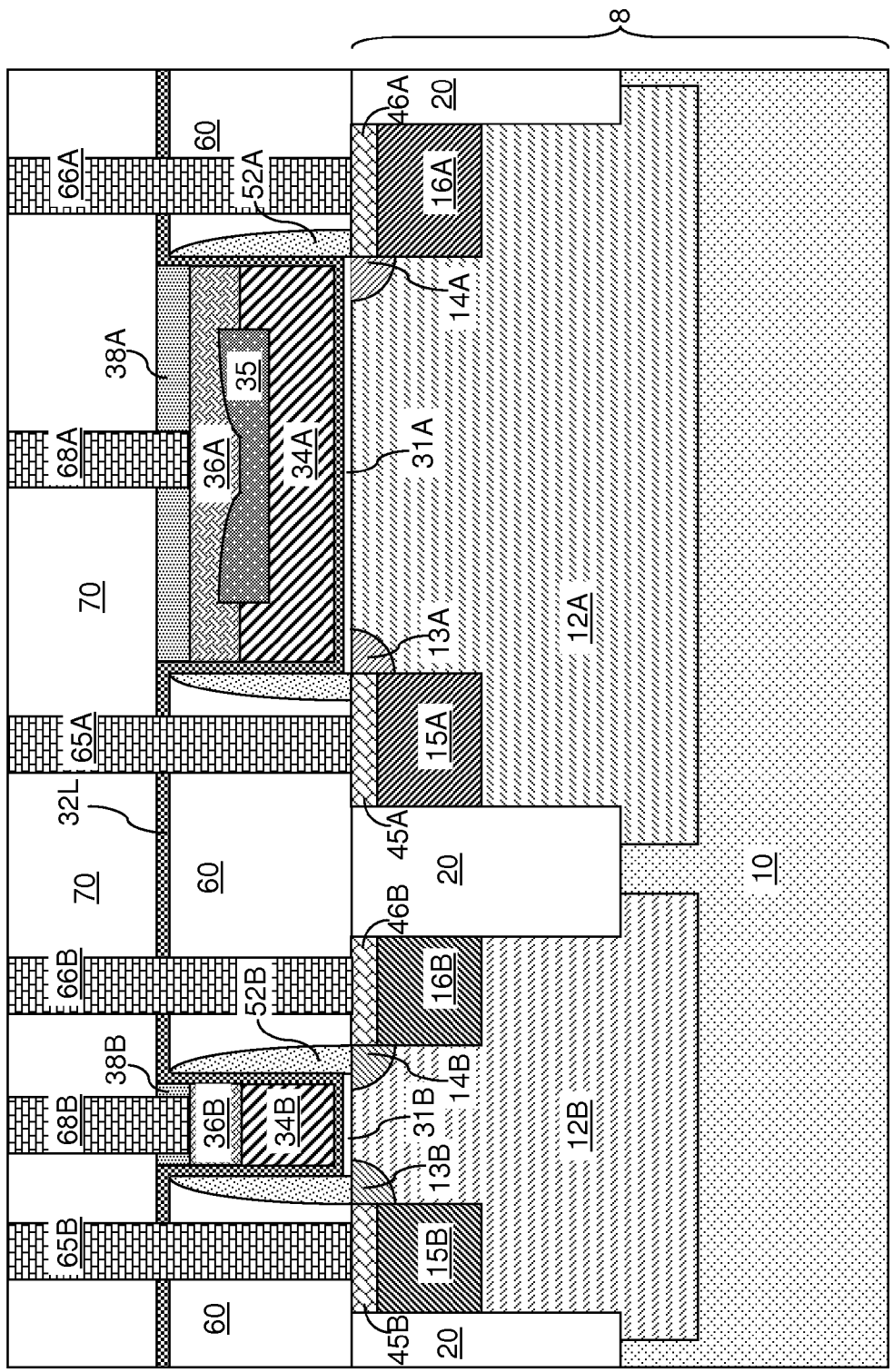
FIG. 13 is a vertical cross-sectional view of the first exemplary semiconductor structure after formation of a contact level dielectric layer and contact via structures according to an embodiment of the present disclosure.

Referring to FIG. 13, a contact level dielectric layer 70 can be deposited over the planarization dielectric layer 60. Various contact via structures can be formed, for example, by formation of contact via cavities by a combination of lithographic patterning and an anisotropic etch followed by deposition of a metal and planarization that removes an excess portion of the metal from above the contact level dielectric layer 70. The various contact via structures can include, for example, a first source contact via structure 65A, a first drain contact via structure 66A, a first gate contact via structure 68A, a second source contact via structure 65B, a second drain contact via structure 66B, and a second gate contact via structure 68B. Each source contact via structure (65A, 65B) and each drain contact via structure (66A, 66B) are embedded in the planarization dielectric layer 60 and the contact level dielectric material layer 70. Each source contact via structure (65A or 65B) contacts a source-side metal semiconductor alloy portion (45A or 45B), and each drain contact via structure (66A or 66B) contacts a drain-side metal semiconductor alloy portion (46A or 46B). The first gate contact via structure 68A contacts the first gate electrode (34A, 36A), and the second gate contact structure 68B contacts the second gate electrode (34B, 36B).

Figure 14:
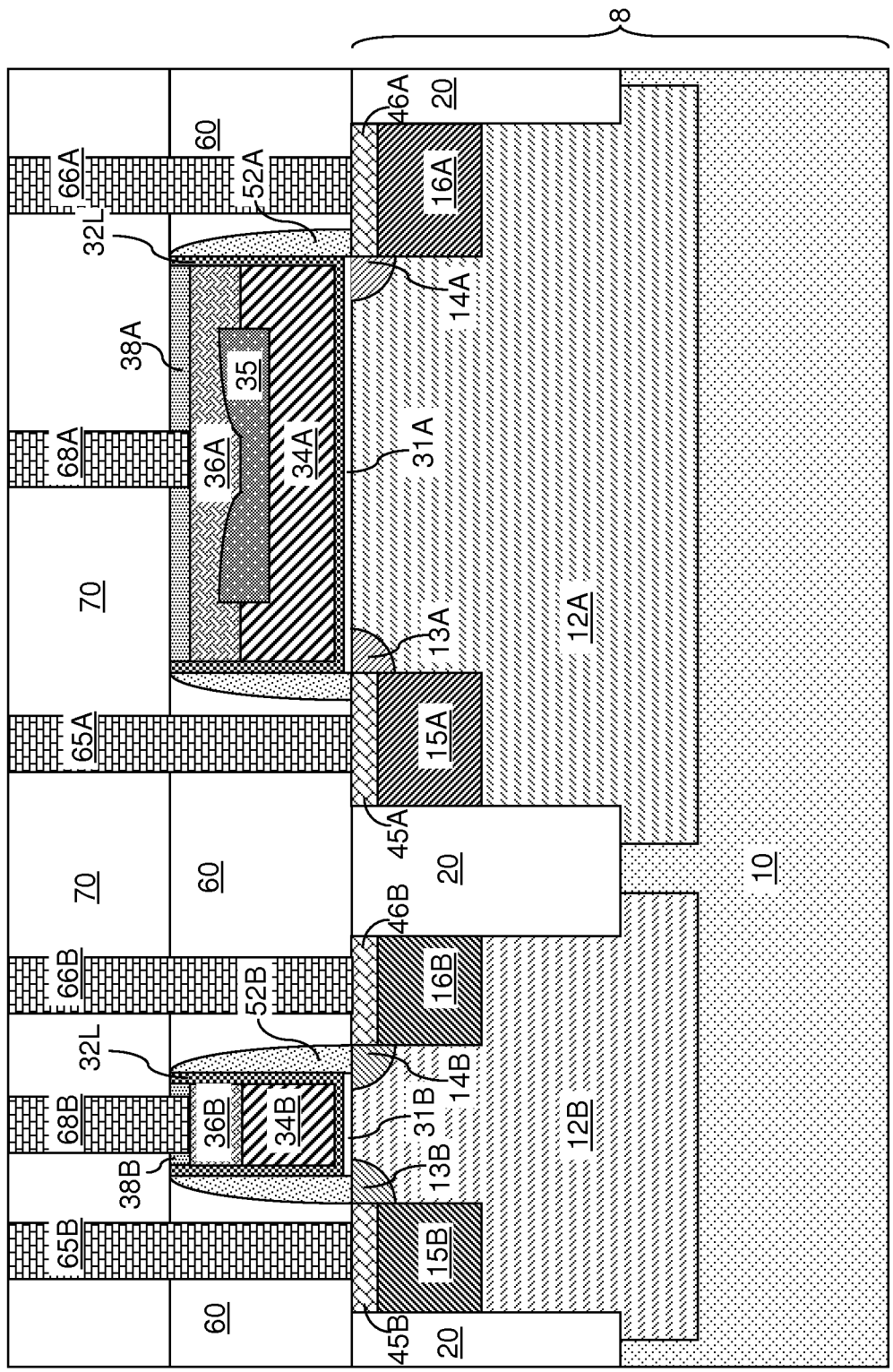
FIG. 14 is a vertical cross-sectional view of a first variation of the first exemplary semiconductor structure according to an embodiment of the present disclosure.

Referring to FIG. 14, the topmost portions of the gate dielectric layer 32L overlying the planarization dielectric layer 60 can be removed during one of the planarization steps or etch steps before deposition of the contact level dielectric layer 70 to form a variation of the first exemplary semiconductor structure. In this case, the contact level dielectric layer 70 is formed directly on a top surface of the planarization dielectric layer 60.

Figure 15:
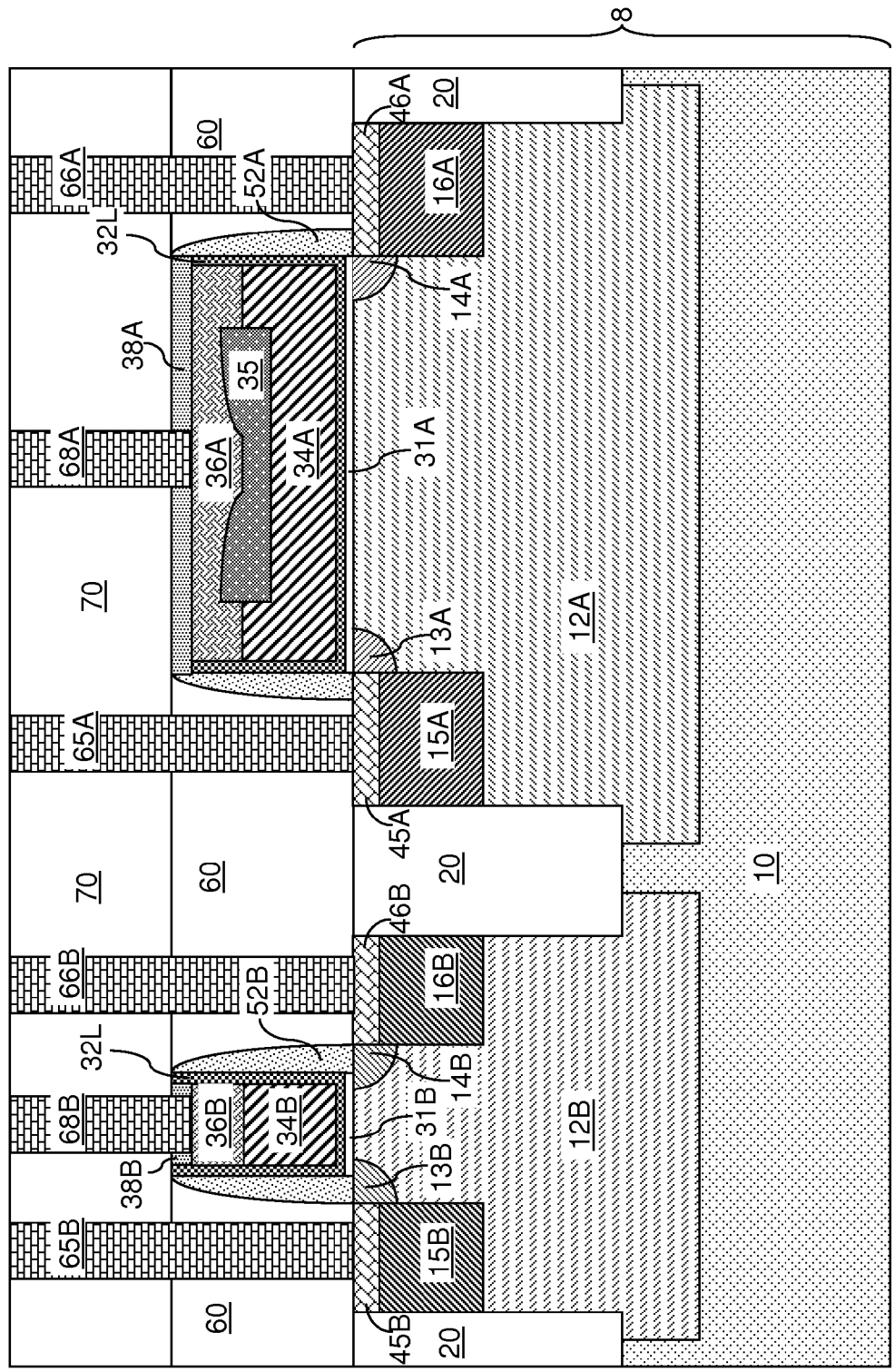
FIG. 15 is a vertical cross-sectional view of a second variation of the first exemplary semiconductor structure according to an embodiment of the present disclosure.

Referring to FIG. 15, portions of the gate dielectric layer 32L can be removed from above the top surfaces of the first conductive material portion 36A and the second conductive material portion 36B prior to deposition of the gate cap dielectric layer to form a second variation of the first exemplary semiconductor structure. In this case, the first gate cap dielectric 38A can laterally contact the first gate spacer 52A, and the second gate cap dielectric 38B can laterally contact the second gate spacer 52B.

Figure 16:
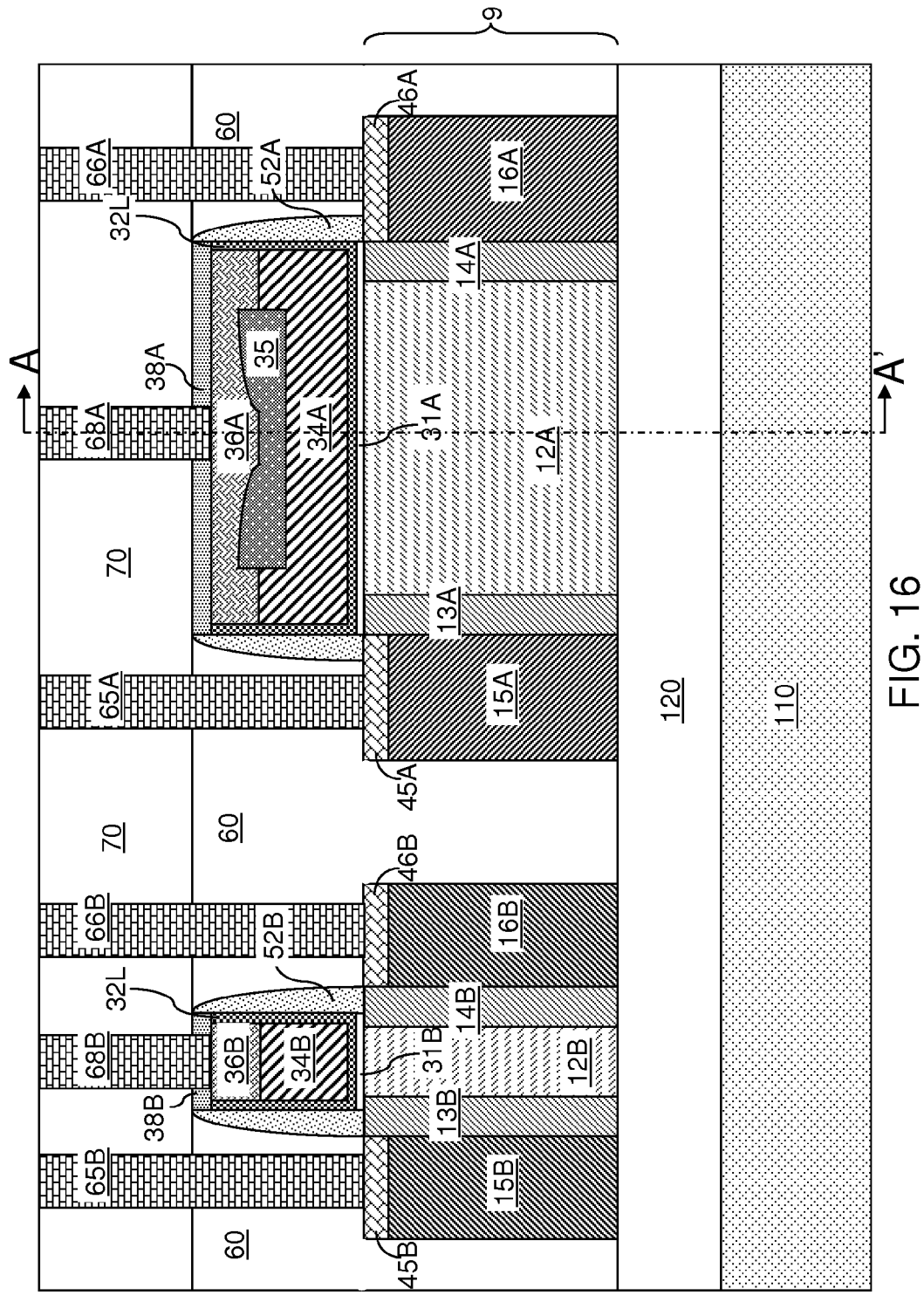
FIG. 16 is a vertical cross-sectional view of a second exemplary semiconductor structure including fin field effect transistors according to an embodiment of the present disclosure.
Figure 16A:
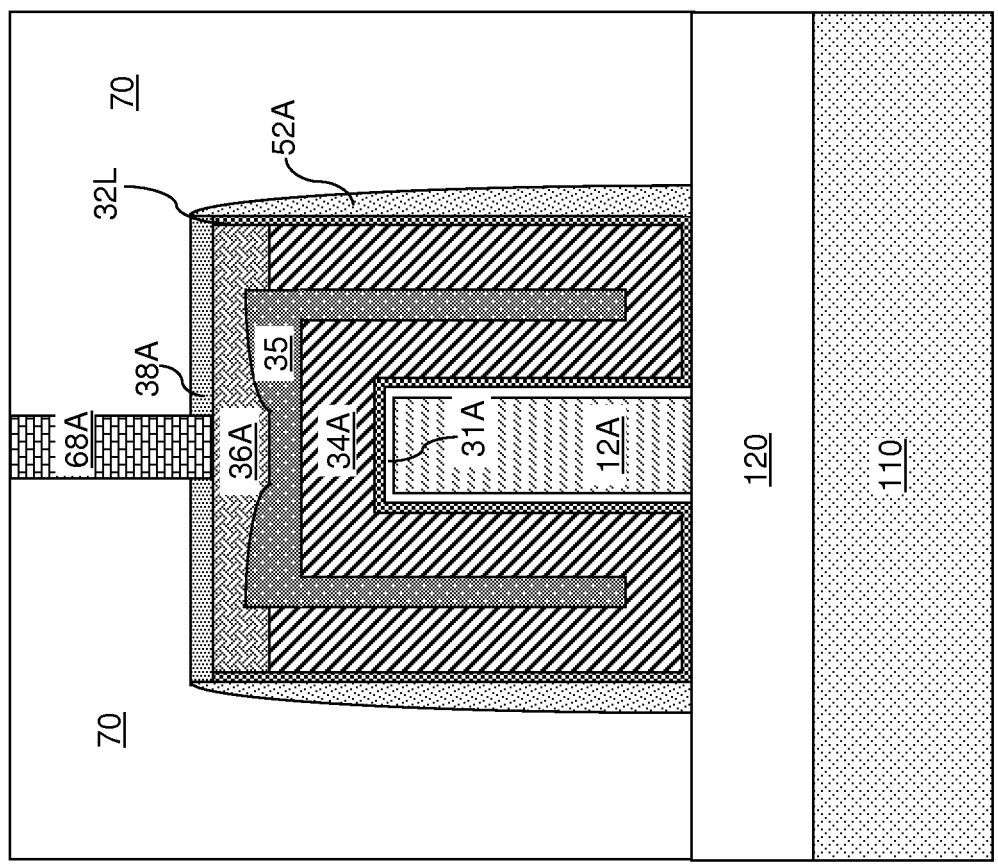
FIG. 16A is a vertical cross-sectional view of the second exemplary semiconductor structure along the vertical plane A-A' of FIG. 15 according to an embodiment of the present disclosure.

Referring to FIGS. 16 and 16A, a second exemplary semiconductor structure according to an embodiment of the present disclosure can be derived from the first exemplary semiconductor structure of the present disclosure by employing semiconductor fins 9 to form fin field effect transistors.

For example, a semiconductor-on-insulator (SOI) substrate including a handle substrate 110 and a buried insulator layer 120, and a top semiconductor layer can be provided. The top semiconductor layer can be patterned to form semiconductor fins 9. For example, a first semiconductor fin can be formed to include a first body region 12A, which extends to the entire volume of the first semiconductor fin, and a second semiconductor fin can be formed to include a second body region 12B, which extends to the entire volume of the second semiconductor fin. The processing steps of FIGS. 1-13 and/or FIGS. 14 and 15 can be performed to form a first fin field effect transistor, in which portions of first body region 12A are converted into a first source extension region 13A, a first drain extension region 14A, a first source region 15A, and a first drain region 16A. Further, the processing steps of FIGS. 1-13 and/or FIGS. 14 and 15 forms a second fin field effect transistor, in which portions of second body region 12B are converted into a second source extension region 13B, a second drain extension region 14B, a second source region 15B, and a second drain region 16B. The first gate stack of the first fin field effect transistor includes a first gate electrode (34A, 36A) that embeds the dielectric material portion 35. Depending on the lateral dimension of the first gate electrode (34A, 36A) along the horizontal direction within the plane A-A', vertically protruding portions of the dielectric material portion may, or may not, be present. Thus, in one embodiment, the entirety of the bottom surface of the dielectric material portion 35 can be planar. In another embodiment, the dielectric material portion 35 can include one or two vertically protruding portions, each having a pair of substantially vertical sidewalls.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure including a field effect transistor (FET), said method comprising:
    forming a gate cavity laterally surrounded by a planarization dielectric layer on a semiconductor substrate, wherein a top surface of said semiconductor substrate is exposed at a bottom of said gate cavity;
    forming a gate dielectric over said top surface of said semiconductor substrate in said gate cavity;
    forming a work function material layer on said gate dielectric;
    forming a dielectric material portion on an horizontal portion of said work function material layer within said gate cavity;
    etching said work function material layer, wherein a remaining portion of said work function material layer becomes a work function material portion; and
    forming a conductive material portion over said dielectric material portion and said work function material portion, wherein a gate electrode of said field effect transistor comprises said conductive material portion and said work function material portion.

2. The method of claim 1, wherein said forming of said dielectric material portion comprises:
    depositing a dielectric material layer on said work function material layer; and
    planarizing said dielectric material layer employing said work function material layer as a stopping layer.

3. The method of claim 2, wherein said forming of said dielectric material portion further comprises recessing a remaining portion of said dielectric material layer employing physically exposed portions of said work function material layer as an etch mask.

4. The method of claim 3, wherein a topmost surface of said dielectric material portion is recessed below a topmost surface of said planarization dielectric layer by said recessing of said remaining portion of said dielectric material layer.

5. The method of claim 3, wherein said etching of said work function material layer comprises recessing said work function material layer below a topmost surface of said dielectric material portion employing said dielectric material portion as an etch mask.

6. The method of claim 1, wherein said forming of said conductive material portion further comprises:
   depositing a conductive material layer on said dielectric material portion and said work function material portion;
   planarizing said conductive material layer; and
   recessing a remaining portion of said conductive layer after said planarizing of said conductive material layer below a topmost surface of said planarization dielectric layer.

7. The method of claim 1, further comprising forming a gate cap dielectric on said conductive material portion by filling a remaining portion of said gate cavity with a gate cap dielectric material and planarizing said gate cap dielectric material.

8. The method of claim 1, further comprising:
   forming a disposable gate structure on said semiconductor substrate prior to forming said planarization dielectric layer; and
   planarizing said planarization dielectric layer, wherein a topmost surface of said disposable gate dielectric is coplanar with a top surface of said planarization dielectric layer after said planarizing, and said gate cavity is formed by removing said disposable gate structure.

9. The method of claim 1, wherein said semiconductor structure includes another field effect transistor (FET), and said method further comprises forming another gate cavity laterally surrounded by said planarization dielectric layer on said semiconductor substrate, wherein another top surface of said semiconductor substrate is exposed at a bottom of said another gate cavity, wherein said work function material layer fills an entirety of said another gate cavity during formation of said work function material layer in said gate cavity.

10. The method of claim 9, wherein said forming of said dielectric material portion comprises:
    depositing a dielectric material layer on said work function material layer; and
    planarizing said dielectric material layer employing said work function material layer as a stopping layer, wherein said dielectric material layer is not present over a portion of said work function material layer that fills said entirety of said another gate cavity after said planarizing of said dielectric material layer.

11. The method of claim 1, wherein said forming the work function material layer comprises depositing a stack of a first titanium nitride layer, a tantalum carbide layer and a second titanium nitride layer.

12. The method of claim 1, wherein said forming the work function material layer comprises depositing a metallic material selected from the group consisting of Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

13. A method of forming a semiconductor structure including a field effect transistor (FET), said method comprising:
    forming a gate cavity laterally surrounded by a planarization dielectric layer on a semiconductor substrate, wherein a top surface of said semiconductor substrate is exposed at a bottom of said gate cavity;
    forming a gate dielectric over said top surface of said semiconductor substrate in said gate cavity;
    forming a work function material layer on said gate dielectric;
    forming a dielectric material portion on an horizontal portion of said work function material layer within said gate cavity, said dielectric material portion has a topmost surface that is recessed below a topmost surface of said planarization dielectric layer;
    etching said work function material layer, wherein a remaining portion of said work function material layer becomes a work function material portion; and
    forming a conductive material portion over said dielectric material portion and said work function material portion, wherein a gate electrode of said field effect transistor comprises said conductive material portion and said work function material portion.

14. The method of claim 13, wherein said forming the work function material layer comprises depositing a stack of a first titanium nitride layer, a tantalum carbide layer and a second titanium nitride layer.

15. The method of claim 13, wherein said forming the work function material layer comprises depositing a metallic material selected from the group consisting of Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof.

16. The method of claim 13, further comprising:
    forming a disposable gate structure on said semiconductor substrate prior to forming said planarization dielectric layer; and
    planarizing said planarization dielectric layer, wherein a topmost surface of said disposable gate dielectric is coplanar with a top surface of said planarization dielectric layer after said planarizing, and said gate cavity is formed by removing said disposable gate structure.

17. The method of claim 13, wherein said semiconductor structure includes another field effect transistor (FET), and said method further comprises forming another gate cavity laterally surrounded by said planarization dielectric layer on said semiconductor substrate, wherein another top surface of said semiconductor substrate is exposed at a bottom of said another gate cavity, wherein said work function material layer fills an entirety of said another gate cavity during formation of said work function material layer in said gate cavity.

* * * * *